(12) United States Patent
Fahim et al.

(10) Patent No.: US 10,084,983 B2
(45) Date of Patent: Sep. 25, 2018

(54) WAFER-SCALE PIXELATED DETECTOR SYSTEM

(71) Applicant: Fermi Research Alliance, LLC, Batavia, IL (US)

(72) Inventors: Farah Fahim, Glen Ellyn, IL (US); Grzegorz Deptuch, Forest Park, IL (US); Tom Zimmerman, St. Charles, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 68 days.

(21) Appl. No.: 15/167,595

(22) Filed: May 27, 2016

(65) Prior Publication Data

US 2017/0230597 A1   Aug. 10, 2017

Related U.S. Application Data

(63) Continuation-in-part of application No. 14/696,651, filed on Apr. 27, 2015, now Pat. No. 9,794,499.

(60) Provisional application No. 61/985,809, filed on Apr. 29, 2014.

(51) Int. Cl.
*H04N 5/378*   (2011.01)
*H04N 5/374*   (2011.01)
*H01L 27/146*   (2006.01)

(52) U.S. Cl.
CPC ......... *H04N 5/378* (2013.01); *H01L 27/1469* (2013.01); *H01L 27/14623* (2013.01); *H01L 27/14632* (2013.01); *H01L 27/14634* (2013.01); *H01L 27/14636* (2013.01); *H01L 27/14687* (2013.01); *H04N 5/374* (2013.01)

(58) Field of Classification Search
CPC .......... H01L 27/1469; H01L 27/14634; H03H 19/004; H03K 5/00
See application file for complete search history.

(56) References Cited

U.S. PATENT DOCUMENTS

| | | | | |
|---|---|---|---|---|
| 5,066,955 A | * | 11/1991 | Scheerer | H03M 1/0697 341/166 |
| 5,125,008 A | * | 6/1992 | Trawick | G01S 7/4004 375/349 |
| 5,247,581 A | * | 9/1993 | Gurcan | G05F 3/225 330/10 |

(Continued)

OTHER PUBLICATIONS

Becker, J. et al., "The high speed, high dynamic range camera AGIPD," 2013 IEEE Nuclear Science Symposium and Medical Imaging Conference, Seoul, Korea, Oct. 27-Nov. 2, pp. 1-5.

(Continued)

*Primary Examiner* — Cynthia Segura
(74) *Attorney, Agent, or Firm* — Kevin Soules; Kermit D. Lopez; Luis M. Ortiz

(57) ABSTRACT

A large area, gapless, detection system comprises at least one sensor; an interposer operably connected to the at least one sensor; and at least one application specific integrated circuit operably connected to the sensor via the interposer wherein the detection system provides high dynamic range while maintaining small pixel area and low power dissipation. Thereby the invention provides methods and systems for a wafer-scale gapless and seamless detector systems with small pixels, which have both high dynamic range and low power dissipation.

20 Claims, 15 Drawing Sheets

(56) References Cited

U.S. PATENT DOCUMENTS

| | | | | |
|---|---|---|---|---|
| 5,373,410 | A * | 12/1994 | Schreiber | G01R 15/125 361/119 |
| 5,905,398 | A * | 5/1999 | Todsen | H03K 17/693 327/337 |
| 6,330,274 | B1 * | 12/2001 | Uehara | H04B 1/707 375/150 |
| 8,041,003 | B2 | 10/2011 | Astley et al. | |
| 8,073,417 | B2 * | 12/2011 | Chang | H03F 3/19 455/279.1 |
| 8,842,027 | B2 * | 9/2014 | Huang | H03M 1/1057 341/120 |
| 9,041,580 | B2 * | 5/2015 | Okura | H03M 1/468 341/156 |
| 9,093,363 | B2 | 7/2015 | Sukegawa et al. | |
| 9,385,714 | B2 * | 7/2016 | Bechman | H03K 19/0013 |
| 9,496,858 | B2 * | 11/2016 | Rostaing | G01T 1/17 |
| 9,584,012 | B2 * | 2/2017 | Ng | H02M 3/155 |
| 9,754,523 | B2 * | 9/2017 | Lee | G09G 3/20 |
| 9,780,942 | B2 * | 10/2017 | Talty | H04L 5/1461 |
| 9,806,734 | B1 * | 10/2017 | Madan | H03M 1/1245 |
| 9,853,843 | B2 * | 12/2017 | Talty | H04L 27/0002 |
| 2002/0074637 | A1 | 6/2002 | McFarland | |
| 2002/0181277 | A1 * | 12/2002 | Micheloni | G09G 3/006 365/175 |
| 2003/0040294 | A1 * | 2/2003 | Staszewski | H03D 7/125 455/337 |
| 2004/0080637 | A1 | 4/2004 | Nakamura et al. | |
| 2004/0095495 | A1 | 5/2004 | Inokuma et al. | |
| 2007/0279131 | A1 * | 12/2007 | Yamaguchi | H03F 1/26 330/254 |
| 2008/0013243 | A1 * | 1/2008 | Gammel | H04L 12/10 361/118 |
| 2008/0042046 | A1 | 2/2008 | Mabuchi | |
| 2008/0069733 | A1 * | 3/2008 | Maltezos | B01L 3/50273 422/82.05 |
| 2009/0147118 | A1 * | 6/2009 | Karim | H04N 3/1506 348/302 |
| 2010/0217568 | A1 * | 8/2010 | Takeuchi | G06F 17/5009 703/2 |
| 2010/0226495 | A1 * | 9/2010 | Kelly | G11B 20/00086 380/30 |
| 2010/0276572 | A1 | 11/2010 | Iwabuchi et al. | |
| 2011/0051888 | A1 | 3/2011 | Astley et al. | |
| 2011/0121819 | A1 * | 5/2011 | Minch | G01N 33/48728 324/123 C |
| 2012/0133807 | A1 | 5/2012 | Wu et al. | |
| 2012/0293698 | A1 | 11/2012 | Sukegawa et al. | |
| 2012/0298877 | A1 * | 11/2012 | Dinapoli | G01T 1/243 250/370.01 |
| 2013/0278334 | A1 * | 10/2013 | Murugesan | H03F 3/3022 330/192 |
| 2015/0229859 | A1 * | 8/2015 | Guidash | H04N 5/374 348/308 |

OTHER PUBLICATIONS

Shi, X. et al., "Challenges in chip design for the AGIPD detector," Nuclear Instruments and Methods in Physics Research A (2010) 624:387-391.

Becker, J. "AGIPD—The Adaptive Gain Integrating Pixel Detector for the European XFEL. Development and Status," 2011 IEEE Nuclear Science Symposium Conference Record, N39-5, pp. 1950-1954.

Hart, M. et al., "Development of the LPD, a High Dynamic Range Pixel Detector for the European XFEL," 2012 IEEE Nuclear Science Symposium and Medical Imaging Conference, N2-5, pp. 534-537.

Ip, H. M. D. et al., "A Dynamic Slew Correction Circuit for Low Noise Silicon Detector Pre-amplifiers," IEEE Transactions on Nuclear Science (2012) 59(3):642-646.

Hatsui, T., "Development and Deployment Status of X-ray 2D Detector for SACLA," Pixel (2012) 33 pages.

Hatsui, T. et al., "A direct-detection X-ray CMOS image sensor with 500 μm thick high resistivity silicon," Proc. Int. Image Sensor Workshop (2013) vol. 3, 4 pages.

* cited by examiner

WAFER-SCALE PIXELATED DETECTOR SYSTEM

CROSS REFERENCE TO RELATED PATENT APPLICATIONS

This patent application is a continuation in part of U.S. patent application Ser. No. 14/696,651, titled "Wafer-Scale Pixelated Detector System," filed Apr. 27, 2015. U.S. patent application Ser. No. 14/696,651 is herein incorporated by reference in its entirety. U.S. patent application Ser. No. 14/696,651 claims the priority and benefit under 35 U.S.C. § 119(e) of U.S. provisional patent application 61/985,809, entitled "WAFER-SCALE PIXELATED DETECTOR SYSTEM WITH LARGE AREA, LARGE DYNAMIC RANGE AND EASILY EXPANDABLE", filed on Apr. 29, 2014. U.S. Provisional Patent Application Ser. No. 61/985,809 is herein incorporated herein by reference in its entirety.

STATEMENT OF GOVERNMENT RIGHTS

The invention disclosed in this application was made with Government support under the Fermi Research Alliance, LLC, Contract Number DE-AC02-07CH11359 awarded by the U.S. Department of Energy. The Government has certain rights in the invention.

FIELD OF THE INVENTION

The present invention is related to a large area, highly segmented camera system. The invention is further related to methods and systems for a wafer-scale gapless and seamless radiation detector with small pixels, which has both high dynamic range and low power dissipation.

BACKGROUND

Currently available hybrid pixel detectors are constructed by bonding custom Application Specific Integrated Circuits (ASICs) to a relatively small sensor slab. Coverage of a larger area is then obtained by tiling or shingling together some number of modules, which leads to gaps in coverage along the module boundaries.

The architecture of existing pixel front-end circuitry for large dynamic range is typically an adaptive-gain active integrator, which is a high gain amplifier with switchable capacitors in the feedback loop. Different capacitors are switched in on-the-fly during integration, depending on the signal amplitude. To achieve large dynamic range with this scheme, the total integration capacitance must be large, which forces either large pixel size or limited dynamic range. In addition, an image of the signal charge must be actively sourced with high bandwidth by the amplifier and power supply, requiring relatively large bias currents and unacceptably high power dissipation.

Therefore, there is a need in the art for new methods, systems, and apparatuses for wafer-scale gapless and seamless detectors with small pixels, which have both high dynamic range and low power dissipation.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a gapless detector.

It is another aspect of the disclosed embodiments to provide a gapless detector comprising a sensor and an application specific integrated circuit.

It is another aspect of the disclosed embodiments to provide methods and systems for a wafer-scale gapless and seamless detector systems with small pixels, which could include a large area interposer.

It is yet another aspect of the disclosed embodiments to provide an electrical network of a multi-channel system of the front-end circuit for processing of signals from a radiation sensor which has both high dynamic range and low power dissipation.

The technology disclosed herein, related to large area and large dynamic range pixel detectors with no dead space, is of interest in a wide range of applications from correlated X-ray spectroscopy, diffraction studies, high flux pump probe, small molecule imaging, and compressed matter states, etc. It is also applicable for all types of position sensitive detectors, timing and energy spectroscopic detectors in High Energy and Nuclear Physics, Photon Science, and Material Science, etc. The embodiments can be extended to other applications where segmentation is important, for example, on digital read out Geiger-mode avalanche photodiodes, known also as digital Silicon Photo-Multipliers (SiPMs). The range of potential uses also includes medical imaging, for example, high sensitivity clinical radiography.

The aforementioned aspects and other objectives and advantages can now be achieved as described herein. A method and system for a large area, gapless, detection system comprises at least one sensor; an interposer operably connected to the at least one sensor; and at least one application specific integrated circuit operably connected to the sensor via the interposer wherein the detection system provides high dynamic range while maintaining small pixel area and low power dissipation. Thereby the invention provides methods and systems for a wafer-scale gapless and seamless detector systems with small pixels, which have both high dynamic range and low power dissipation.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
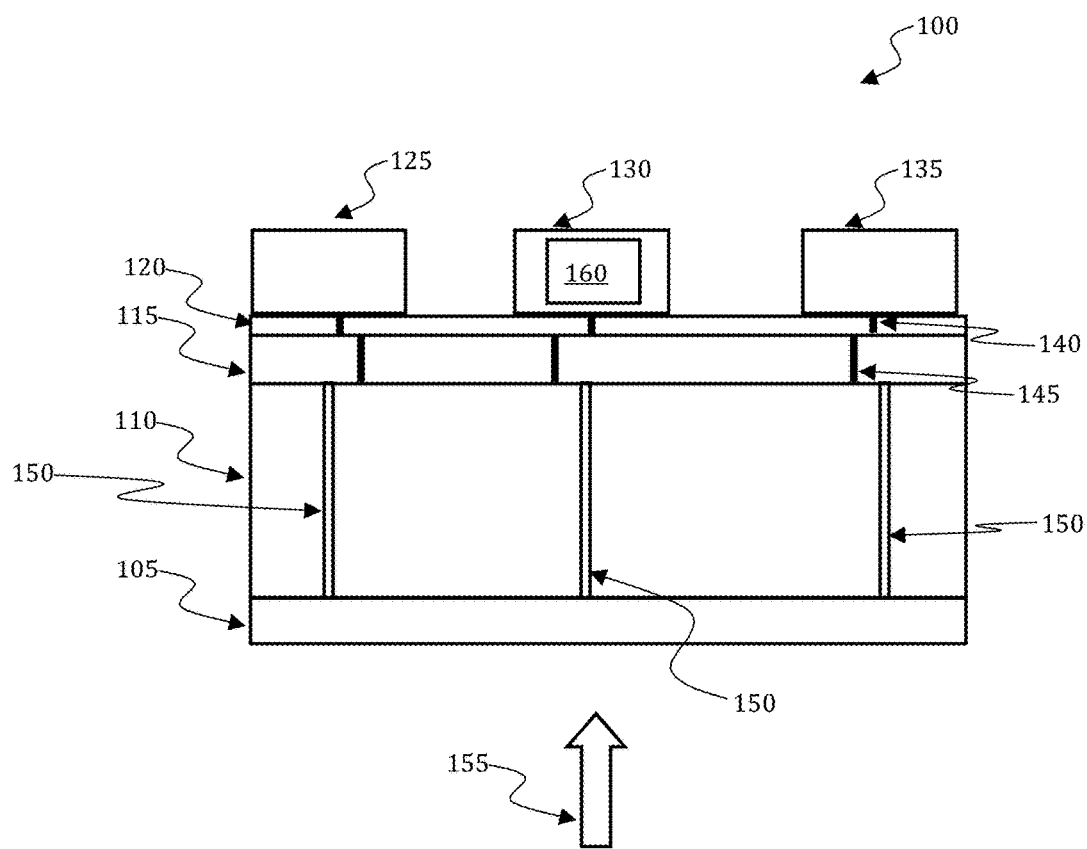
FIG. 1 depicts a block diagram of a large area, highly segmented pixilated detector system in accordance with the disclosed embodiments.

The particular values and configurations discussed in these non-limiting examples can be varied and are cited merely to illustrate at least one embodiment and are not intended to limit the scope thereof.

GLOSSARY OF TERMS: The following terms describe various aspects of the embodiments of the invention.

Wafer scale: Large area, seamless structure (without any dead zones). In relation to the methods of fabrication of integrated circuits, an obvious size unit is a wafer, but, generally, the scale is herein not limited to any particular geometry (shape, size, or thickness), it can conceivably also be a part of a wafer cutout or any other geometry.

Large dynamic range: $1 \times 10^2 e-$ to $1 \times 10^{10} e-$. The upper limit is restricted by pixel size in combination with capability of a sensor to deliver charge packets without collapsing the electric field in the sensor or affecting the charge collection in any other way, to cover the entire dynamic range, gain can be divided in ranges, the number of gain ranges can be multiple with the minimum number equal to 1 and the maximum not specifically defined but limited by parameters, like pixel size, power requirements, or as required by an application.

Pixilated ASIC: An Application Specific Integrated Circuit (ASIC), which contains an array of at least one pixel which includes an entire processing chain with or without additional functions located at the chip periphery. The layout of pixels and of the pixel arrays is not restricted to any particular geometry or functionality. All pixels have input pads for connecting to sensor.

Pixilated sensor: Any large area pixilated/segmented sensing material, which produces charge signals in response to incident radiation. Its segmentation defines pixels.

Interposer: A large area sheet, which can be covered with additional metal layers on top and bottom such that each metal layer is isolated by a dielectric layer. The metal layers can be patterned to create electrically conducting routing traces. The sheet material can be semiconductor (e.g., Silicon) or dielectric (e.g., glass). It also consists of thru holes (depending on the type of material, they are also called TSV, thru silicon via, or TGV, thru glass via). The thru hole (TSV/TGV) can be used to make one or more connections between the innermost top and bottom metal layers. The thru holes can be plugged or plated to make an electrical connection. Preferably, the thru holes need to be isolated from the substrate, such that there are no unwanted or parasitic connections between them. Electrical connection across the metal layers can be made using inter-metal connection vias. The outermost top and bottom metal layers can be used to also make pads, which are used to bond components on both sides. Any number of metal layers and traces can be used for connectivity between one or more detector pixels to one or more ASIC pixels.

Tapering: Pitch adaptation achieved through routing of one or more metal layers on the interposer to connect a sensor and an ASIC with different pixel sizes. Tapering can be achieved by metal routing; this is one key part of building a gapless detector through adaptation of intentionally different pixel pitches on a sensor and on an ASIC.

Readout: Readout schemes include either extraction of data in analog or digital form following selective-sparsified or raw-unprocessed information flow from the chips.

Application: Any application that requires large area imaging including, but not limited to, high energy physics, medical imaging, imaging for photon science, etc.

Embodiments described herein are for a pixilated detector system whose basic module size well exceeds that of any currently available device. Its size can be equal to that of a full sensor wafer and the embodiments described herein can be completely seamless with no dead zones. The system consists of three major components: a wafer-scale sensor with any number of pixels—preferably up to the order of a million pixels or greater depending on its size; an interposer, such as a Silicon interposer (also called a Silicon Printed Circuit Board or SiPCB) or a glass interposer, which serves as an interconnection device and pitch adapter between the entire sensor wafer (and sensor wafer pixels) and a number of smaller readout Application Specific Integrated Circuits (ASICs) (and ASIC pixels); and the third component is one or more custom front-end readout ASICs (which contain one or more pixel arrays). The custom front-end readout ASICs may include pixels up to and including tens of thousands of pixels, which implements a novel design concept to achieve high dynamic range while maintaining both small pixel area and low power dissipation.

In one embodiment, illustrated in FIG. 1, a large area, highly segmented pixilated detector system 100 is shown whose basic module size well exceeds that of any currently available device. Its size, for example, can be equal to that of a full sensor wafer and the system 100 is completely seamless with no dead zones. The sensor 105 serves to collect illumination such as X-rays or other radiation, illustrated by arrow 155. The system 100 consists of a sensor 105, which is preferably wafer scale and may have on the order of a million pixels. An interposer 110 is operably connected to the sensor 105 and serves as an interconnection device and pitch adapter between the sensor wafer pixels on the sensor 105 and a number of smaller readout ASICs 125, 130, and 135. The interposer 105 may be a SiPCB or other such known device. The custom front-end readout ASICs 125, 130, and 135 can have multiple processing channels arranged in an array of 1 or more pixels. In one embodiment, this may include any number of pixels. It should be appreciated that any number of ASICs may be equivalently used, and the illustration of three such ASICs is exemplary only and not intended to limit the scope of the invention. It should be understood that ASICs 125, 130, and 135 could all include the same circuit topology and functionality, or one or more of ASICs 125, 130, and 135 could have one or more different circuit topologies and could have one or more different pixel and/or peripheral functionalities depending on design considerations.

Interposer 105 can include a (semiconductor/dielectric) sheet layer 110 and several metal layers such as 115 and 120. Layers 110, 115, and 120 are all electrically isolated from each other using dielectric layers (not shown). These three layers are shown merely for purposes of illustration and more or fewer layers may be included as necessary depending on design consideration. The interposer may include vias 150 which are holes through the various layers of the interposer. These vias 150 can be plugged or plated with conducting material to provide electrical connection between the metal layer (115) on the top and another layer at the bottom. They are however isolated from each other. One or more of layers 115 and 120 may also include a plurality of electrically conducting inter-metal via connections 140 and 145. The thru holes, metal layer traces, and inter-metal vias together provide electrical connection between the sensor 105 and the various ASICs 125, 130, and 135. The interposer 105 can also include a pad configured to bond various components to the interposer 105. The interposer 105 is configured for re-routing and tapering of the detector pixel associated with the sensor 105 to pixels associated with ASICs 125, 130, and 135, so that there are enough gaps for power and signal routing on the interposer 105 and placement for passive components between ASICs. This also allows area for peripheral functionality on the ASIC itself.

Another component of the invention is the front-end 160, which may be embodied as a pixel or an array of pixels within ASIC 125, 130, and/or 135, and associated electronics. The front end 160 is configured to absorb photon pulses over a large dynamic range within a small pixel area and requires low power consumption. The pixel area may be any area, but is preferably approximately 100 microns on a side. Low power consumption is achieved with a concept referred to as current splitting with multiple scaled ranges. The front end 160 electronics require integration of a wide dynamic range charge (1 fC to approx. 1.6 nC) from the detector. In order to achieve both the required precision at the low end and adequate dynamic range, an 'intelligent' front end where the sensitivity changes with signal size is required. This is challenging because of the potentially large value of charge that must be integrated and the large transient currents involved. The front-end 160 may be embodied as a pixel front-end in ASIC 125, 130, and/or 135.

Figure 2:
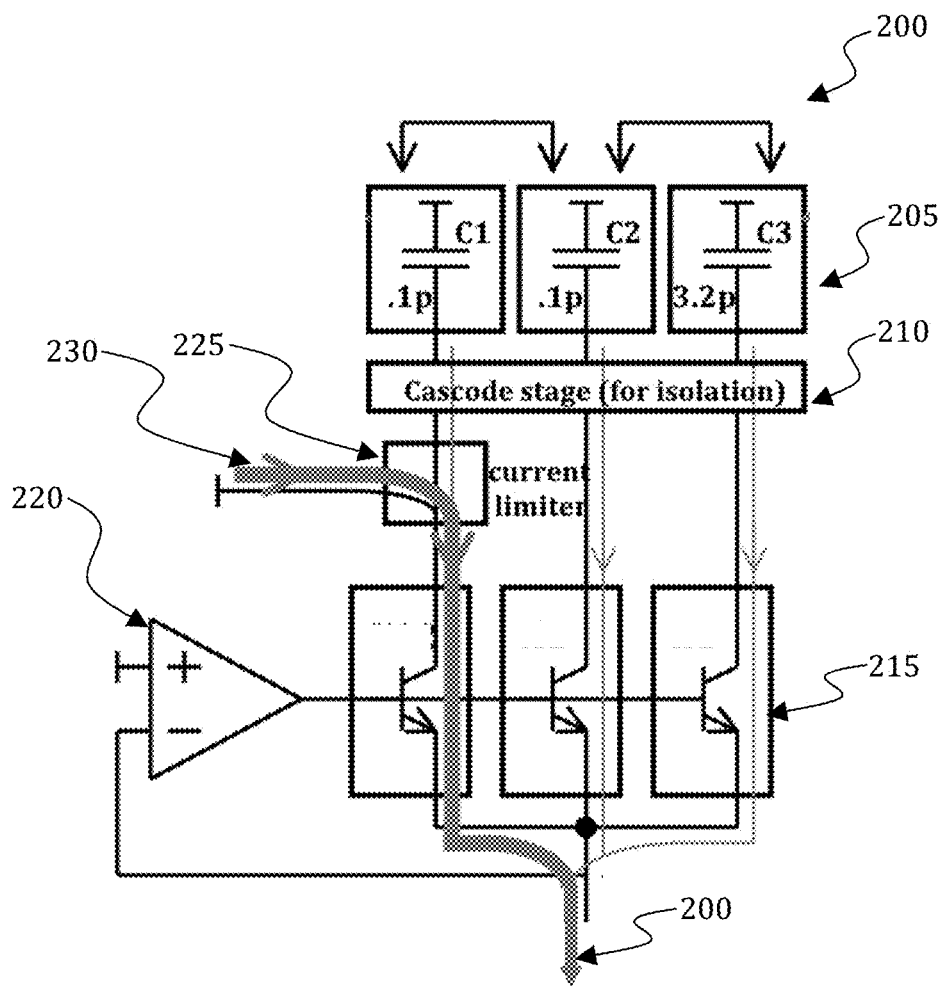
FIG. 2 depicts a block diagram of an electrical network of a front-end circuit based on a bipolar current splitter in accordance with the disclosed embodiments.

FIG. 2 illustrates an electrical network of a bipolar current splitter 200 associated with the front end 160. Bipolar current splitter 200 includes passive integrators 205, cascode stage 210, 3-range current splitters 215, feedback amplifier 220, and current limiter 225. The current limiter could be placed before or after the cascode stage. FIG. 2 illustrates a passive excess charge dump 230. It should be understood that this arrangement could be replaced by active integrators (not shown) depending on design considerations.

The current splitters 215 can be formed from several bipolar transistors with paralleled base-emitter junctions and scaled emitter areas. All the emitters of these bipolar transistors are connected together; similarly, all the bases can also be connected together. Bipolar transistors may be required because unlike MOSFET (Metal Oxide Semiconductor Field Effect Transistor), they have the unique property of maintaining a constant split ratio over very wide dynamic range, even in the presence of random transistor mismatch. The current splitter must have low input impedance in order to keep the detector bias voltage constant and to absorb the signal charge quickly. Therefore, it is incorporated into a feedback amplifier 220, which requires only modest DC bias current. Each of the splitter outputs feeds either a passive or an active integrator 205. In this way, the signal itself is integrated and does all the work.

This architecture has several advantages. With current splitting and excess charge dumping, the power supply does not have to actively source an image signal charge. This keeps the required area and power low. For large signals where the top (least sensitive) range is relevant, the top range integrator sees only a small well-known fraction of the signal current. Therefore, the required integration capacitance value (and pixel area) is much smaller than would be otherwise required, resulting in a very significant area benefit. Preferably the biggest integration capacitance value required is approximately 3 pF, as opposed to 100 pF or more, which may be required for classical charge sensitive amplifiers. In addition, the large signal current on the most sensitive range can be simply shunted away to AC ground, or "dumped," as shown by arrow 230, since it carries no additional useful information. Since all ranges integrate simultaneously, the input cannot be polluted with any switching transients.

Figure 3:
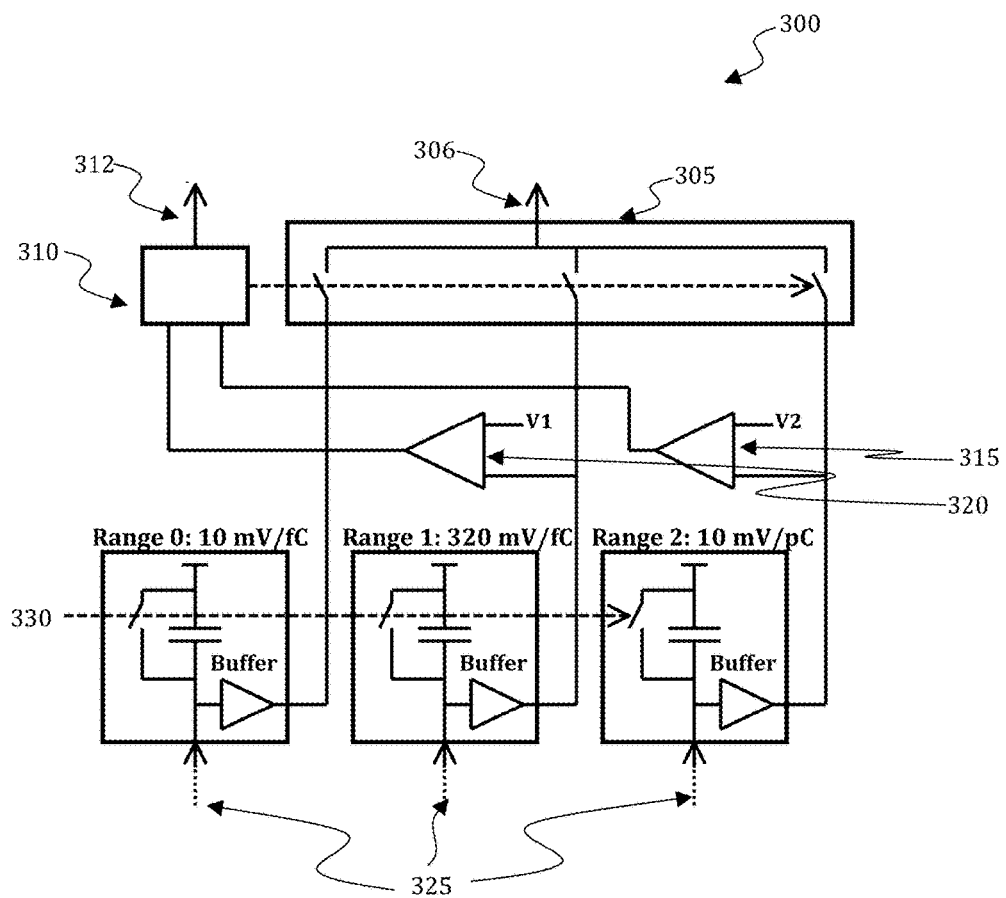
FIG. 3 depicts a block diagram of a gain selector in accordance with the disclosed embodiments.

FIG. 3 illustrates system 300 and associated components for selecting the most suitable gain range to store. The system 300 includes integrator inputs 325 from the 3-range current splitter, such as that illustrated in FIG. 2. Reset switches 330 are provided. Discriminators 315 and 320 are operably connected to range logic unit 310, which provides a digital range code shown by arrow 312. A multiplexer 305 also provides analog output to a storage array as shown by arrow 306.

Figure 4:
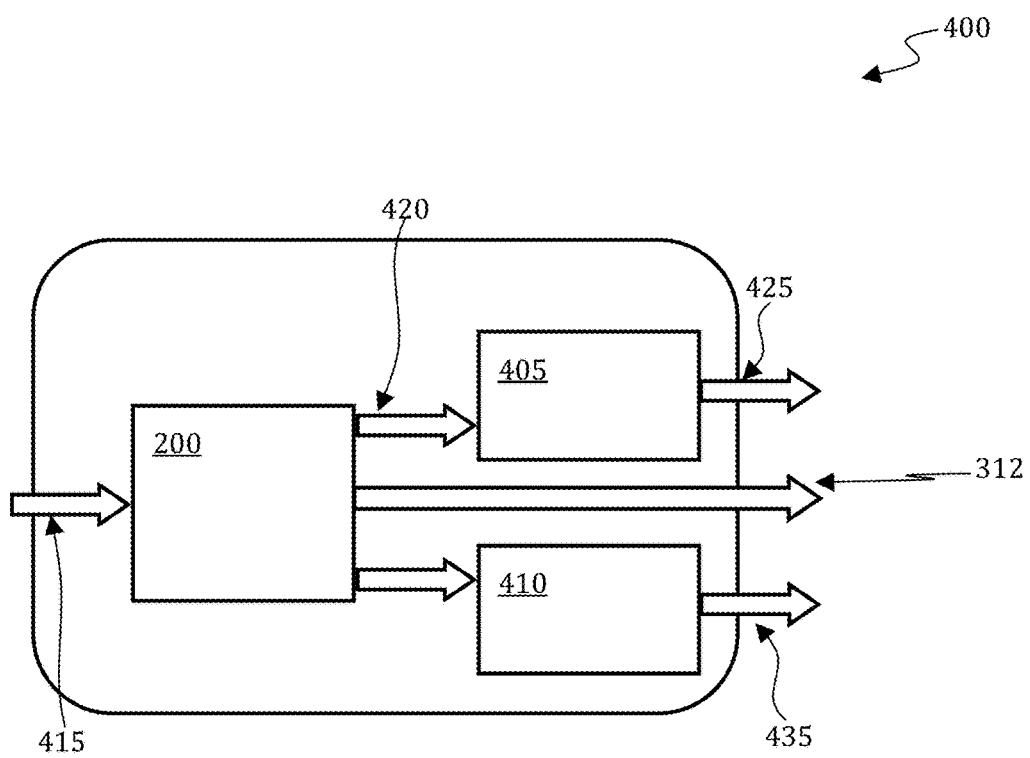
FIG. 4 depicts a block diagram of a system in accordance with the disclosed embodiments.

FIG. 4 illustrates a block diagram of a system 400 associated with methods and systems described herein. System 400 receives input 415 from the sensor. Current splitter 200 then provides an analog output 420 to analog storage array 405. The analog storage array can then provide a pixel analog output 425. The current splitter 200 also provides a digital range code 312 and input to a digital stretcher 410. Digital stretcher 410 provides a pixel digital output 435.

Analog storage array 405 provides in-situ storage of any number of one or more images in the ASIC (the actual number results from satisfying the application needs, but can be larger with some impact on the pixel footprint). The ASIC acquires signals from the sensor and stores the results in the in-pixel capacitor storage bank. In this way, the ASIC can, for example, take multiple images at a rate commiserate with the source. After the frames are taken and stored in the ASIC, the images are read out to a data acquisition system at a slower speed.

In the front-end scheme illustrated in FIGS. 2-4, the signal current is simultaneously integrated on multiple ranges with different sensitivities, and then based on the signal amplitude, one appropriate range is chosen for digitization. The signal current is divided into several scaled ranges with a current splitter, such as current splitter 200, and integrated simultaneously on all ranges with simple passive, resettable integrators. There is no on-the-fly range switching during integration. The scaling factor between ranges is set by a combination of current split ratios and integration capacitance ratios. With only three ranges, a scaling factor of one thousand may be achieved between the highest and lowest ranges. The ratios given by a number of transistor and integrating capacitors in the figures are given for reference only; other values can be used without changing the principle. In other embodiments, active integrators can be used alternatively.

The presence of multiple ranges of signal integration requires a digital range selector, whose sole role is to choose the appropriate measurement range for storing the signal amplitude after the signal has been integrated. Range comparators detect the highest "saturated" range and then choose the next highest range output for storage. The back-end part of a pixel may have various functionalities including, for example, in-situ storage of images acquired in bursts at high speed. The images can be acquired at frequencies in the multi-MHz range. It could also include analog to digital converters (ADC) to digitize the stored analog value. Depending on the available area, these ADC's can also be located in the ASIC periphery.

In one embodiment of system 100, preferable design parameters include: tapering from a large detector pixel to a small ASIC pixel. This may be from 150×150 µm^2 on the sensor side to about 130×130 µm^2 on the ASIC side. The tapering connection is achieved in the interposer. Preferably, a full reticle size ASIC of 19.6 mm×21.6 mm may contain 22500 pixels (150×150 pixels array). This corresponds to an active pixel area of 19.5 mm×19.5 mm. The additional pixel area on the ASIC may be used for peripheral circuits that include, but are not limited to: bandgap reference circuitry, DACs to generate on-chip biases, digital and analog buffers, pads for providing power to the ASIC, decoupling of biases, analog output of storage capacitors, and analog to digital converters. It should be appreciated that each pixel associated with an ASIC connects to a sensor pixel of larger geometry. Thus, an array of 150×150 pixels occupies an area of 22.5 mm×22.5 mm.

The interposer can be any thickness, but may be preferably selected to be up to several hundred micrometers in order to provide shielding of ASICs from radiation damage such as exposure to radiation fluxes from the backside.

The sensor 105 may include multiple pixels of any size and geometrical arrangement. The sensor 105 wafer may be permanently fusion bonded, or bonded by any other known surface-to-surface bonding means, to one side of the interposer 110, which may be, for example, an SiPCB wafer. The SiPCB interposer 110 can comprise multiple layers of metal to taper the smaller pixel size on the ASIC to the larger pixel size in the sensor 105. The taper allows multiple ASICs to be bonded to the SiPCB on the side opposite the sensor 105. ASICs can be tested and only known good dies can be selected in order to improve yield.

The smaller pixel size on the ASIC (compared to the sensor pixel size) provides spacing between the ASICs. With this geometry the vertical and horizontal space between ASICs may be any number, but is typically up to a few mm. These limits may not be symmetrical in vertical and horizontal spaces between ASICs depending on where and how the periphery is placed in the ASIC. The additional horizontal/vertical space can be used for routing power and analog signals from the ASIC to the connector. Other components for decoupling, biasing, or buffering can also be placed in these spaces.

In a preferred embodiment for the Advanced Photon Source at Argonne (APS), the smaller pixel size on the ASIC (compared to the sensor pixel size) provides adequate spacing between the ASICs. With this geometry, the vertical and horizontal space between ASICs may preferably be 0.9 mm and 2.9 mm, respectively. These limits may be interchangeable depending on where and how the periphery is placed in the ASIC. The additional horizontal space can be used for routing power and analog signals from the ASIC to the connector. In-situ storage of at least 48 images in the ASIC (the actual number results from satisfying the application needs but can be larger, with some impact on the pixel footprint). The ASIC acquires signals from the sensor and stores the results in the in-pixel capacitor storage bank. In this way, the ASIC can, for example, take 48 images at a frame rate of 6.5 MHz or 13 MHz. After the 48 frames are taken and stored in the ASIC, the images are read out to a data acquisition system at a slower speed.

In another embodiment, the sensor 105 can be a standard design, although it is a full wafer dead-area-free device. The preferable sensor material is silicon, but other known materials may alternatively be used. For example, other materials such as CdTe, CdZTe, Ge, GaAs, etc., can be used in some applications.

The interposer 110 is also preferably of wafer size and is permanently attached to the sensors using a wafer fusion bonding technique or other known surface-to-surface bonding technique. The interposer 110 is a device featuring thru (Silicon or Glass) Vias, (TS/GVs), such as vias 150 and several metal routing layers. The fused sensor and interposer form a flat bed, to which multiple ASICs 125, 130, and 135 can be bump bonded (as an example, the fused assembly can be made of an 8-inch diameter sensor wafer and multiple 2×2 cm^2 ASICs). The major role of the interposer is to taper a larger pixel size on the sensor 105 to a smaller pixel size on the ASICs 125, 130, and 135, which creates space between ASICs 125, 130, and 135 for adequate placement clearance, trace routing, and discrete components. This tapered structure enables the seamless output of the system and avoids the modular nature that is typical of existing hybrid detectors. The interposer 110 also has the benefit of shielding the ASICs from radiation damage.

In another embodiment, the invention comprises a detector, front end electronics, and includes wafer scale integration as described below.

In this embodiment, a detector or sensor 105 may comprise an NPN bipolar current splitter. The detector may comprise an n-on-p or an n-on-n sensor as it can deal only with one polarity of collected charges. Alternatively, if supporting technology allows, PNP splitter can be used for p-on-n type sensors.

In one embodiment supporting applications associated with APS, the frontend electronics illustrated in FIGS. 2-4 and described above may be used in 24/48 bunch mode. For pump-probe experiments, and other such applications, which generally store a pump image and probe image using the same x-ray bunch, 48 images can be stored in an ASIC. This allows storage of 24 pump images and 24 probe images, corresponding to two images per x-ray bunch. The x-ray bunches may come at 150 ns intervals. The ASIC can be designed to acquire the signal from the sensor and transfer the charge to a capacitor storage bank in this time period. In this way, the ASIC can take 48 images at a frame rate of 6.5 MHz (1/153 ns). After the 48 frames are taken and stored in the ASIC, the images are read out to a data acquisition system at a slower speed. Other acquisition rates and/or numbers of stored images can be used depending on the type of application.

It is possible to further utilize the capacitor storage bank by observing that for most exposures, any single pixel will have acquired no photons, especially for weak scattering samples. Using this fact, an n bit digital stretcher for low flux operation can be included in the pixel to only store charge in the capacitor bank if photons exist, the digital circuitry will provide information about the time bucket. In this way, the capacitors can enable the storage of many more images for low photon fluxes in local areas of the detector.

Figure 5:
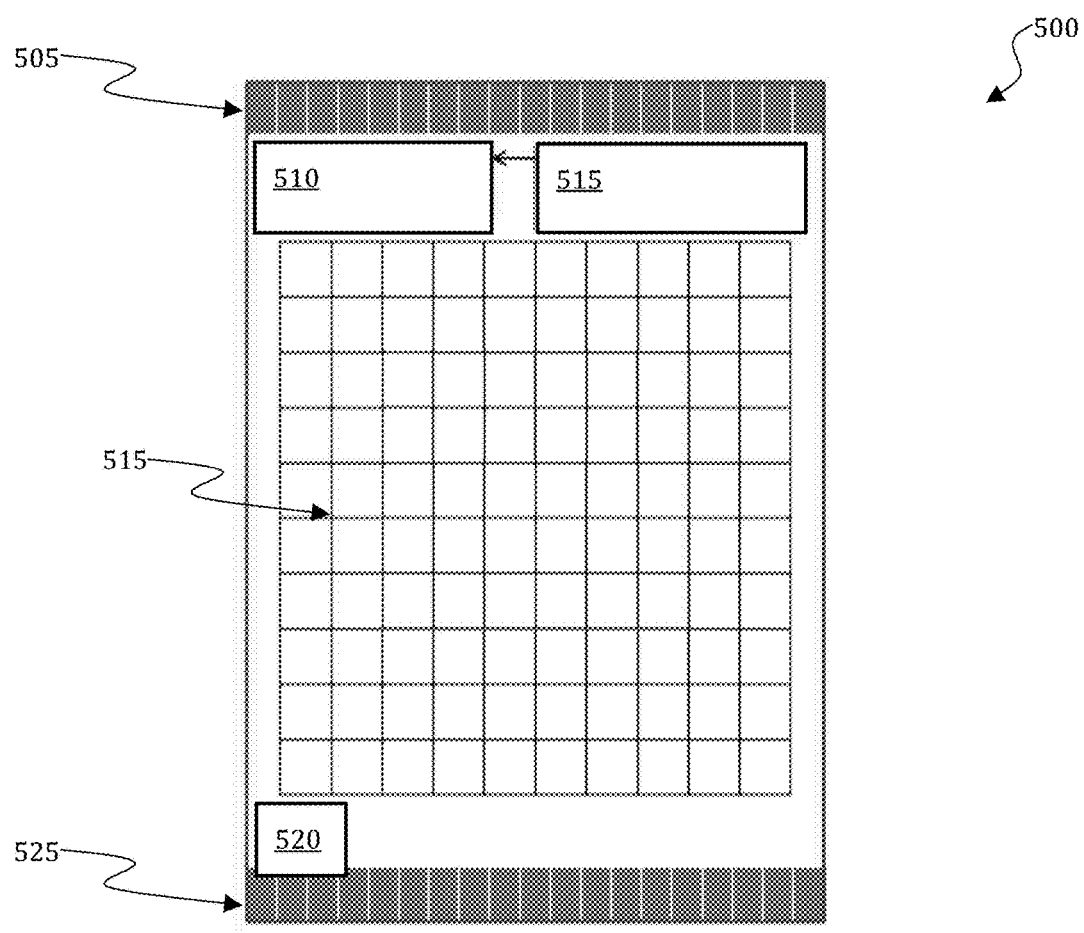
FIG. 5 depicts a block diagram of an ASIC in accordance with the disclosed embodiments.

FIG. 5 illustrates an exemplary ASIC floor plan 500, which contains an array of pixels 530 in accordance with embodiments of the present invention. The pixel block diagram includes an active pixel area 530, a power on reset 520, DACs for band gap 515, and band gap 510. The ASIC block diagram further includes bias decoupling, I/O and Power pads 505 and 525. ASIC 500 may have additional functional blocks (not shown) such as lines drivers, receivers, buffers, etc.

In an embodiment of an ASIC 500 which contains an array of pixels 530, the ASIC 500 may be embodied as a full reticule size ASIC of 19.6 mm×21.6 mm which can contain 22,500 pixels (150×150 array) with a pixel size of 130 µm×130 µm. This would correspond to an active pixel area of 19.5 mm×19.5 mm. The additional space on the ASIC can be used to add bandgaps 510 and DACs 515 to generate on chip biases, could additionally have ADC's to convert the analog output to a digital signal, and pads 505 and 525 for providing power to the ASIC, decoupling of biases, and analog output of storage capacitors.

Figure 6:
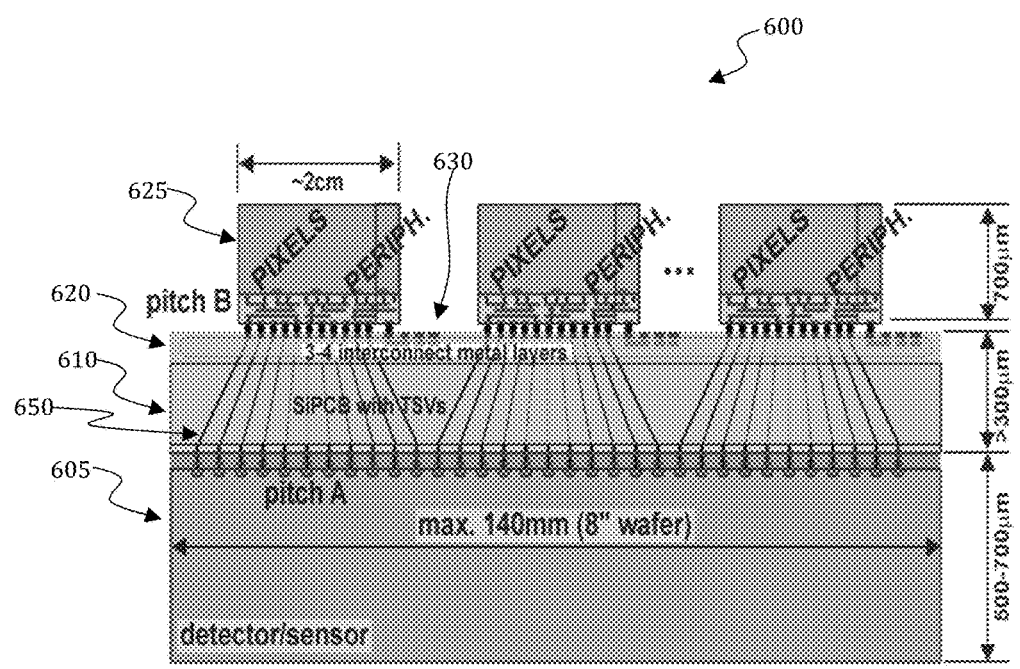
FIG. 6 depicts a block diagram of a large area, highly segmented pixilated detector system in accordance with the disclosed embodiments.

Wafer scale integration can be achieved via an interposer, optionally embodied as an SiPCB. FIG. 6 illustrates an exemplary embodiment 600 of the system 100 illustrated in FIG. 1. It should be appreciated that the dimensions shown in FIG. 6 are exemplary and are not intended to limit the invention.

The interposer 610 can be used for tapered pitch adaptation, where pitch A associated with detector/sensor 705 is greater than pitch B associated with interposer 610. System 600 can include fusion bonding (or any other type of surface-to-surface bonding techniques) of SiPCB interposer 610 to an n-on-p type sensor 605. Interposer 610 includes TSVs 650 and one or more metal interconnection layers 620 (separated by dielectric layers and connected through intermetal vias). The system 600 includes routing power I/Os 630. It should be understood that interposer 610 provides additional shielding of the ASICs 625 for better radiation hardness. It should be understood that the thru vias are vertical (unless technology permits other angles). The tapering is achieved by the horizontal/vertical or diagonal metal traces of the plurality of metal layers, above, and below the thru vias.

In the embodiment shown for a detector 605, pitch A of 150 µm×150 µm and a pixel array of 150×150, provides a total area is 22.5 mm×22.5 mm. The ASIC 625 pixel area is smaller, thus, pitch A needs to be tapered to 130 µm×130 µm with a total active area of 19.5 mm×19.5 mm and an ASIC 625 size of 19.6 mm×21.6 mm. With the exemplary geometry of FIG. 6, the vertical and horizontal space between ASICs 625 would be 0.9 mm and 2.9 mm respectively. The horizontal space can be used for routing power and analogue signals from the ASIC 625 to the connector.

Figure 7:
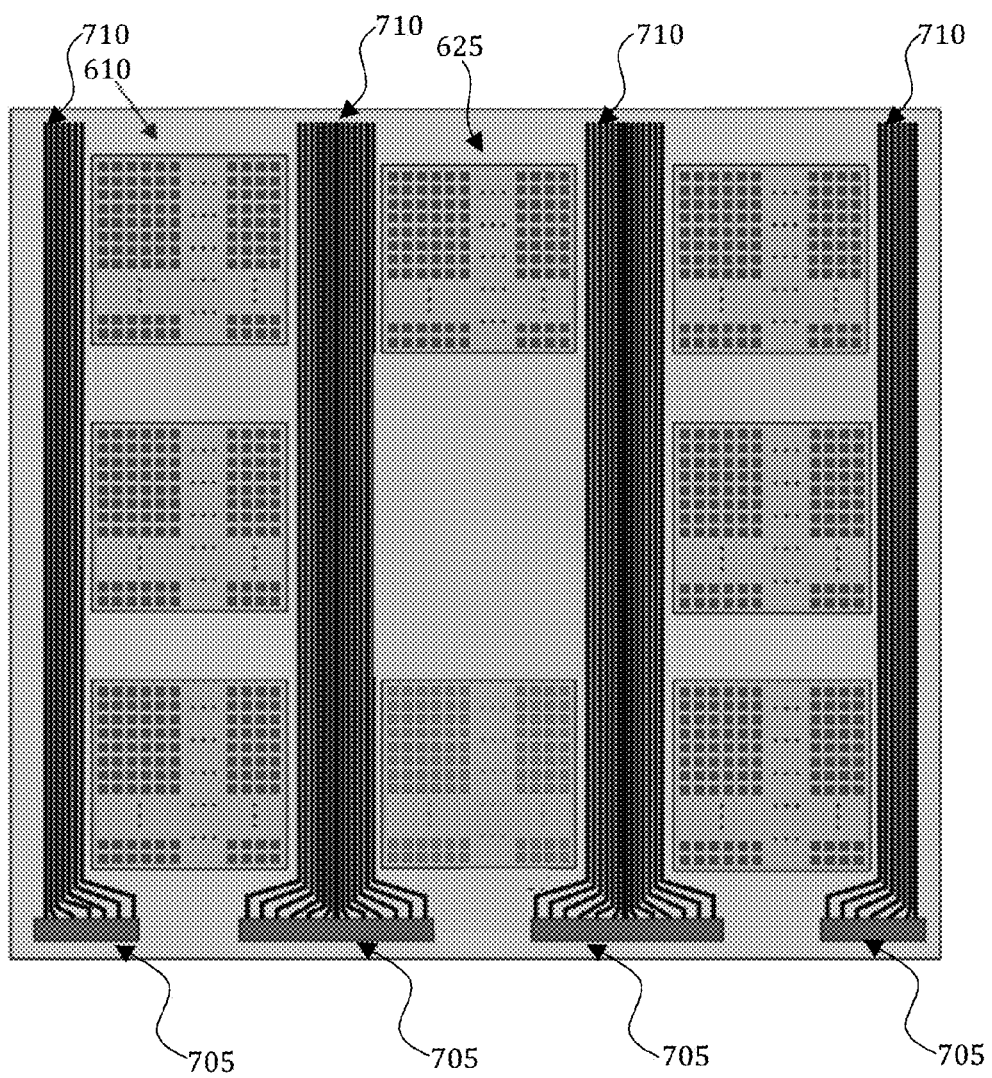
FIG. 7 depicts a top view of an interposer in accordance with the disclosed embodiments.

FIG. 7 illustrates a plan view of an interposer 610 configured as an SiPCB or glass PCB in accordance with embodiments of the invention. For reference, a sensor could be connected to this interposer as described herein, but would be underneath, and therefore out of the view shown in FIG. 7. The interposer 610 includes connections 705 to a plurality of ASICs 625 via traces 710 to allow communication with the ASICs. It should be appreciated that any number of rows and columns of ASICs could be included depending on the size of the interposer 610. In one embodiment, this may include 6 rows by 6 columns of ASICs 625.

Figure 8:
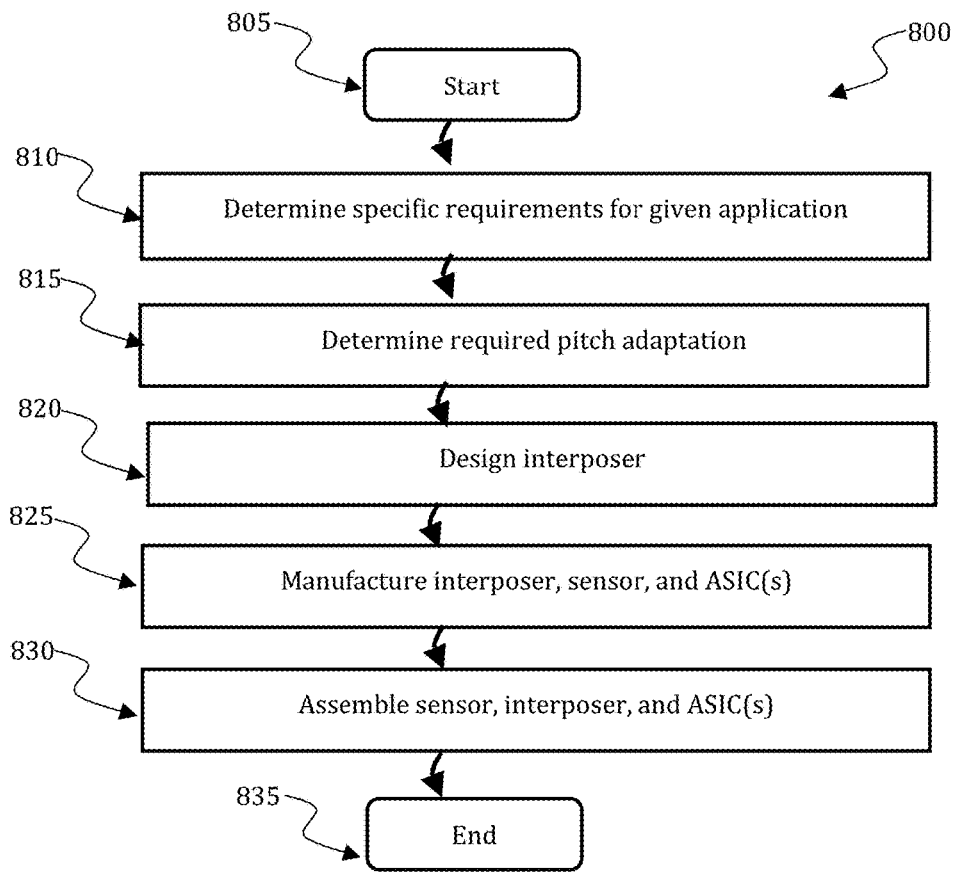
FIG. 8 depicts logical operational steps associated with a method for fabricating a detector in accordance with the disclosed embodiments.

FIG. 8 illustrates logical operational steps associated with a method 800 for fabricating systems and apparatuses described herein. The method begins at step 805. At step 810 specific requirements for a given application can be determined. This step can include determining ASIC functionality and pixel size, defining a sensor area, sensor material, and sensor pixel size, and determining an interposer material and evaluating the associated technology.

This may include determining a detector pixel size (a×b) and array size (n×m). The detector sensitive area is then given as a×n×b×m. The ASIC pixel size is similarly given as (a'×b') and a single ASIC array size (n'×m') can be received. It should be understood that a>a'; b>b'; n>n'; m>m'. The single ASIC is then (a'×n')×(b'×m') plus any peripheral area for pads and control circuitry. The number of ASICs required per detector is then calculated as:

$$\text{Area}(R')=(a'\times n')\times(b'\times m')=\text{peripheral area} \quad (1)$$

The number of ASICs required per detector is then given by $$N(\text{detectors})=h\times v \quad (2)$$

$$h=n/n' \quad (3)$$

$$v=m/m' \quad (4)$$

Accordingly, the available spacing for routing power and output signals between adjacent ASICs is a×n'–a'×n' in the x-axis and b×m'–b'×m' in the y-axis.

Next at step 815, pitch adaptation is determined. The interposer can be designed at step 820. The interposer must be at least as big as the sensor size plus the periphery area for power and signal routing. The top layer of the interposer may contain bumpbond pads. The individual sizes can be determined by bump technology. The bumpbond pads are arranged in subgroups to bond multiple ASICs. Spacing between pads is required to provide space for power and signal routing from the ASICs. Intermediate layers of the interposer may include one or more sheets and are used for connecting the array patterns of the bottom layer to the bumpbond pads of the top layer. This establishes connections between sensor pixels and ASIC pixels. The intermediate layers can also be used for routing signal and power from the additional ASIC pads to the periphery of the interposer and to create a shielding plane against crosstalk. The bottom layer contains metal pads, the individual sizes of which are determined by the requirements of the thru via design rule. The bottom layer pattern contains an n×m array matching the sensor pixel pitch.

Next at step 825, the sensor, ASIC(s), and interposer can be manufactured. At step 830, the various components are assembled. The sensor can be bonded to the interposer using the thru vias, but the type of via and bonding method will be determined when the interposer technology is selected. The ASICs are bump bonded, or otherwise connected via any other known interconnection technique, to the other side of the interposer.

In an alternative step, the ASICs can be tested. Additional components can also be added and any type of connectivity can be used at the periphery of the interposer to supply power and read output, etc. The method ends at step 835.

The disclosed embodiments (particularly for APS embodiments) provide a wafer size, dead-area free, seamless X-ray detector. The detector provides high fabrication yield by mounting multiple preselected good ASICs on a flatbed comprising a sensor wafer fused to an interposer. Tapered pitch adaptation can be achieved by using a silicon interposer with through silicon vias and multiple layers of routing. The interposer shields the ASICs from radiation damage. Large dynamic range can be achieved while maintaining a small footprint pixel with a front-end based on a bipolar current splitter concept. The analog front end with the current splitter provides low impedance input to efficiently absorb the detector signal, splitting it into scaled ranges whose split ratios remain constant over large dynamic range. The embodiments provide low power consumption by current splitting and shunting away most of any large signal (which does not impact the Signal-to-Noise ratio since this is limited by Poisson statistics for large signals). The signal is integrated without the need for its image to be "sourced" by an amplifier. The signal itself does all the work. For big signals, most of the input charge is simply shunted away, or "dumped". Very modest DC bias currents not exceeding a few 10's of uA are required, resulting in relatively low power dissipation. The biggest integration capacitance value required can be limited to only 3.2 pF as opposed to prior approaches which may require 100 pF or more. Another embodiment shows how to further reduce the size of the integration capacitor. With a properly tuned feedback amplifier, the input impedance is purely resistive up to very high frequencies (>GHz). Since integration is performed on all 3 ranges simultaneously, there is no range switching on the fly and the input stays very clean. (The range of interest must then be determined after integration is complete.) The embodiments disclosed herein are modular, hence the sensor material can be changed to any material that can be grown in wafer scale and can also be used for energy ranges beyond that of Silicon.

In another embodiment, front-end and back-end blocks include circuitry in a pixilated readout integrated circuit to process charge signals from a pixilated radiation sensor with high dynamic range.

In an embodiment, a multiple gain range front-end can be used in combination with the other embodiments described herein. The front-end can comprise a current splitter whose outputs feed integrators followed by voltage buffers, range selection logic, and a multiplexor to enable the storage of an appropriate gain range in a capacitor storage array. The embodiment may include a backend comprising a common source amplifier to read out the capacitor storage array. The back-end can also include a feature to minimize storage capacitor leakage.

The number of gain ranges and their respective gain ratios are arbitrary. The gain ratios can be determined by combining splitter scaling factors and integration capacitor values. Splitter scaling factors can be realized using multiples of a unit size bipolar transistor. This minimizes split ratio errors due to parasitic emitter resistance.

The integrators may preferably be passive integrators. Passive integrators are preferable because they are simple and have a small area. This requires voltage buffers (to drive the range selection logic and storage array) that are linear and have low input capacitance. Furthermore, the parasitic capacitance on integrator node (illustrated as Node A in FIG. 12) must be small compared to the integrator capacitance. Therefore, a current limit circuit can be placed before the cascode. The cascode transistor can be small.

An adjustable current limit function can be defined as $R_{limit}$ such that a resistor and bipolar transistor have a base at Vb2. This can be adjusted so that no current is diverted until a signal is big enough to insure that the range of interest is the highest range.

A sample switch can be opened to end the integration period, after which sufficient time must be allowed for the buffer to settle before range selection. Then, the buffer output can be transferred to a storage array capacitor.

A clamp transistor is included to avoid saturation of a bipolar transistor and a reference (REF) stage can be added for pseudo-differential operation. This configuration offers some degree of common-mode cancellation In a specific embodiment, the ASIC may include 3 ranges and have a dynamic range of 10^5. All the integrators may be identical and all scaling can be accomplished with bipolar splitter ratios with identical capacitor values for all ranges. A second splitter can be added to the 3rd stage, it helps with removing the extra current before the cascode stage. Therefore, it further reduces the integrator capacitor required at this stage (from about 3 pF to 100 fF). This provides a very compact layout.

In the embodiment, MOS integrator capacitors are employed. These integrator capacitors must be reset with a voltage bias to obtain constant capacitance.

Equalizing bias currents can be added at Nodes C-F so that each integrator sees the same bias current and traverses the same voltage space. This results in optimal frequency response on all ranges, buffer design that is optimized for one voltage space, storage cap array design optimized for one voltage space, and full pseudo-differential cancellation on all ranges.

The splitter feedback amplifier gain element is MOS (i.e., no input gate current). The amplifier bias current set with external bias voltage does not require current mirrors. In addition, this makes the system immune to variations in supply and ground voltages and provides easily adjustable amplifier properties.

An emitter follower can be used to drive the splitter base which idles at low bias current, but can supply needed splitter base current on demand. It can be biased with an internal resistor and bipolar transistor (i.e., it is self-biased). The amplifier completely self-biases with one external setting.

Figure 9:
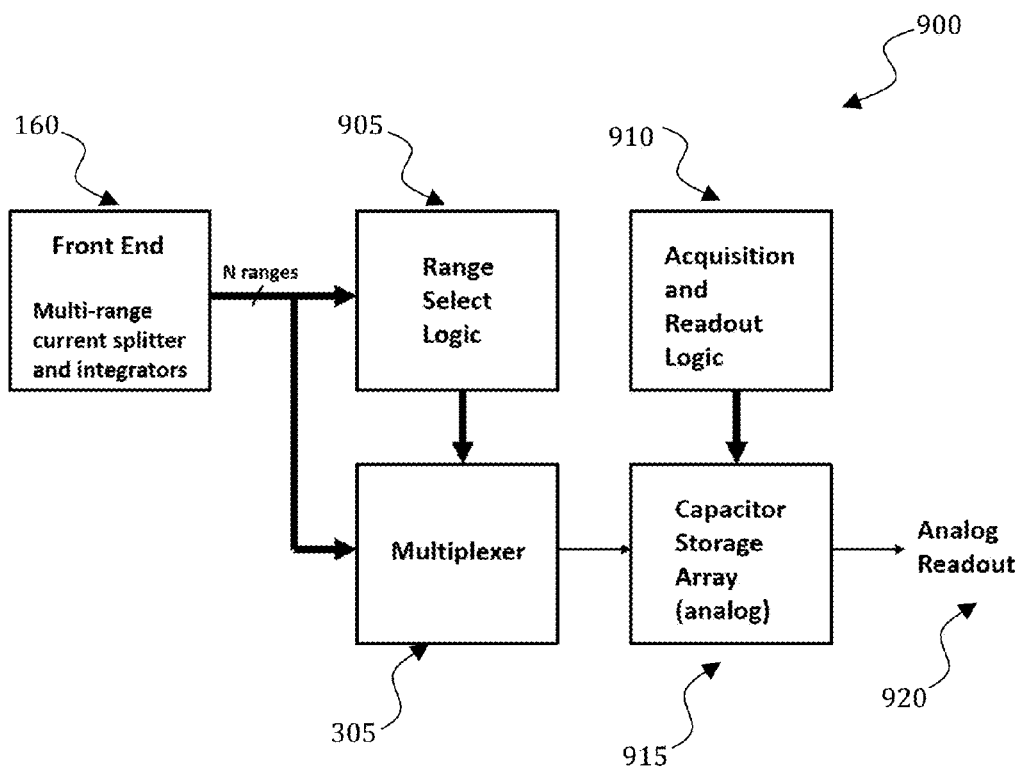
FIG. 9 depicts a block diagram of a pixel readout system in accordance with the disclosed embodiments.

FIG. 9 illustrates a block diagram of a pixel system 900, in accordance with an embodiment. The system 900 includes a front end 160. The front end 160 generally includes a current splitter that creates multiple signal ranges and charge integrators on each of those ranges. In each acquisition cycle when the sensor is exposed to a signal, the n ranges are provided to a range select logic 905 and multiplexer 305. An acquisition and readout logic 910 and the multiplexer provide input signals to the capacitor storage array 915. One range of interest can be selected and routed to the analog memory (i.e., capacitor array 915) for storage and subsequent readout 920. The gain range with the highest sensitivity and which is not saturated is defined as the range of interest.

Figure 10:
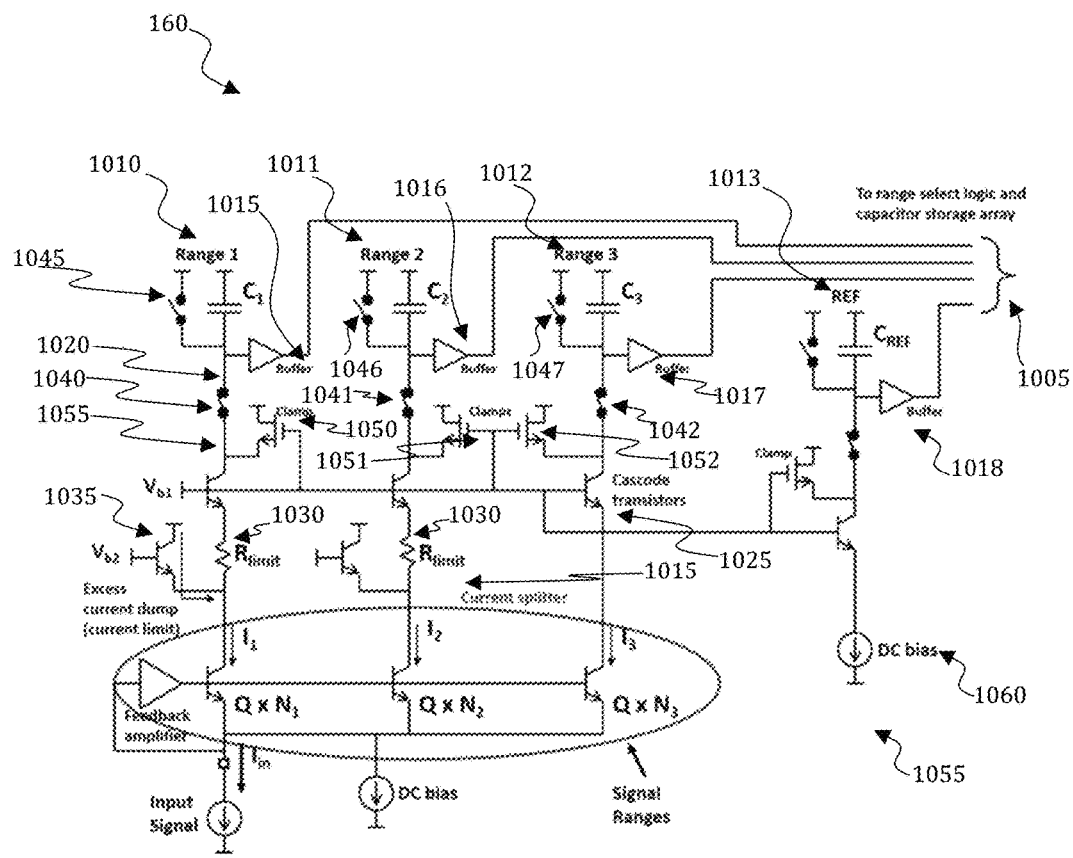
FIG. 10 depicts a diagram of a front end associated with a pixel readout system in accordance with the disclosed embodiments.

FIG. 10 shows a more detailed illustration of the front end 160 and the outputs 1005 provided to a range select logic circuit and a capacitor storage array. The number of ranges and resulting gains can be specifically tailored for a particular application. In FIG. 10, three signal ranges range one 1010, range two 1011, and range three 1012 are shown, along with an optional reference range 1013, but it should be appreciated that any number of ranges is possible.

Range gains are determined by a combination of the range-to-range current splitter 1015 output ratios and the integrator capacitance ratios. The scale factors of the current splitter are determined by the ratios of multiple instantiations of one given unit size transistor. This is necessary to match bipolar transistor (in this case NPN) parasitic emitter resistances. If the parasitics are not matched, the split ratio will not remain constant at high current densities. Unlike simply scaling the emitter area, using multiple instantiations of unit size transistors allows precise definition of the scale factor independent of any parasitic effects. Scale factors can also be determined by the ratios of total emitter area sizes, instead of multiple instantiations.

In an embodiment, the integrators can be passive. Passive integrators require small area, low power consumption, and are simple. Passive integrators are advantageous in certain embodiments because they "let the signal do the work" and avoid the need for an amplifier to source an image current from the power supply as is necessary for integrators including an operational amplifier with an integrating capacitor in its feedback path. The passive integrators require voltage buffers 1015-1018 in order to drive the subsequent circuitry (the range select logic and the capacitor storage array). These buffers must have low input capacitance (compared to the integration capacitance) and linear response over the valid signal range.

With passive integrators, all parasitic capacitance on the integration node (e.g., Node 1020 on range one 1010) contributes to the integration capacitance. This includes the junction capacitance of the switches and cascode transistor and the input capacitance of the respective buffers 1015-1018. In general, these parasitic capacitors are voltage dependent, thus they must be minimized, so that the total integration capacitance remains as constant as possible over its voltage range, resulting in good linearity. Therefore, the current limiting circuitry (which has significant capacitance) must be placed directly at the splitter outputs and before the cascode 1025 in order to isolate it from the integrator.

For large input signals, the current limiting circuitry diverts a large fraction of the splitter output current away from the cascode 1025 to low impedance. This has the advantage that since the cascode transistor 1025 never has to pass a large current, it can be small, minimizing its parasitic capacitance. The smallest gain range typically does not require a current limiting circuit. An adjustable current limit is formed with a resistor $R_{limit}$ 1030 and an NPN transistor 1035 whose base is held at voltage $V_{B2}$. The value of splitter output current at which current begins being diverted away from the cascode 1025 is determined by the values of $R_{limit}$ and $V_{B2}$. This current limit threshold must be set so that the current limiter does not divert any significant signal current until the signal is large enough that the lowest sensitivity (highest) range (Range three for example in FIG. 10) is the range that will be selected by the range select logic.

Figure 11:
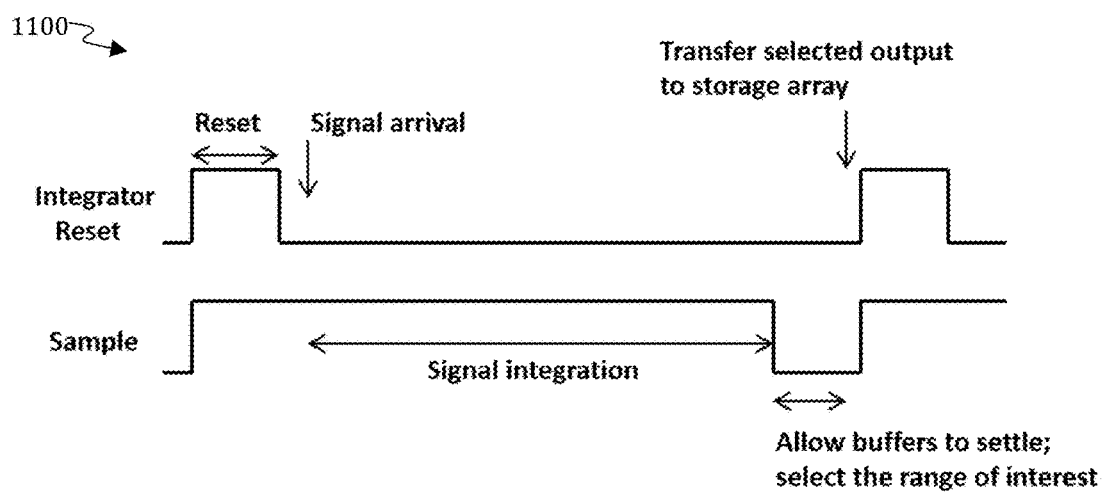
FIG. 11 depicts a timing diagram associated with a pixel readout system in accordance with the disclosed embodiments.

A sample switch (sample switches 1040, 1041, and 1042) is placed between the cascode transistor 1025 and the integrator capacitor of each range. At the end of the desired integration time, the sample switches 1040-1042 must be opened, terminating the integration period. The associated timing is illustrated in chart 1100 in FIG. 11. As shown, some time must be allowed for the integrator buffers to settle, after which the range select logic picks the appropriate range to route to the capacitor storage array. After the buffer output voltage is stored in a single cell of the capacitor array, all integrators are then discharged with their respective reset switches (reset switch 1040, reset switch 1041, and reset switch 1042) in preparation for the next integration period. The value of the reset voltage will depend on the type of capacitor used for physical implementation of the passive integrator, since some capacitor types require a certain voltage bias in order to be in their linear region.

A clamp transistor 1050, 1051, and 1052 (in this case a NMOS) must be placed at the cascode output (Node 1055), so that the bipolar cascode transistor 1025 operation region never enters saturation. If the cascode 1025 were to saturate, which would happen if the integrator voltage moves past its valid range, the cascode base would draw significant current and possibly disrupt the other ranges. The clamp transistor 1050 must not turn on until the integrator is past its valid voltage swing, so that it does not corrupt a valid signal on any of the ranges.

In this embodiment, a reference stage (REF) 1055 is provided. This is a "dummy" range which integrates only DC bias current 1060 and no signal, allowing the operating of the system in a pseudo-differential configuration. The analog output of this stage is stored in the capacitor array along with the appropriate signal range output. Upon readout of the array, the stored values of both the signal and the reference are read out. The difference between these two values forms a pseudo-differential output signal. In this way, common mode effects such as varying DC bias current and power supplies are cancelled out to first order, at least on the most sensitive range. The concept is also valid and will work without this dummy reference range, but its inclusion is preferable in order to enhance performance.

Figure 12:
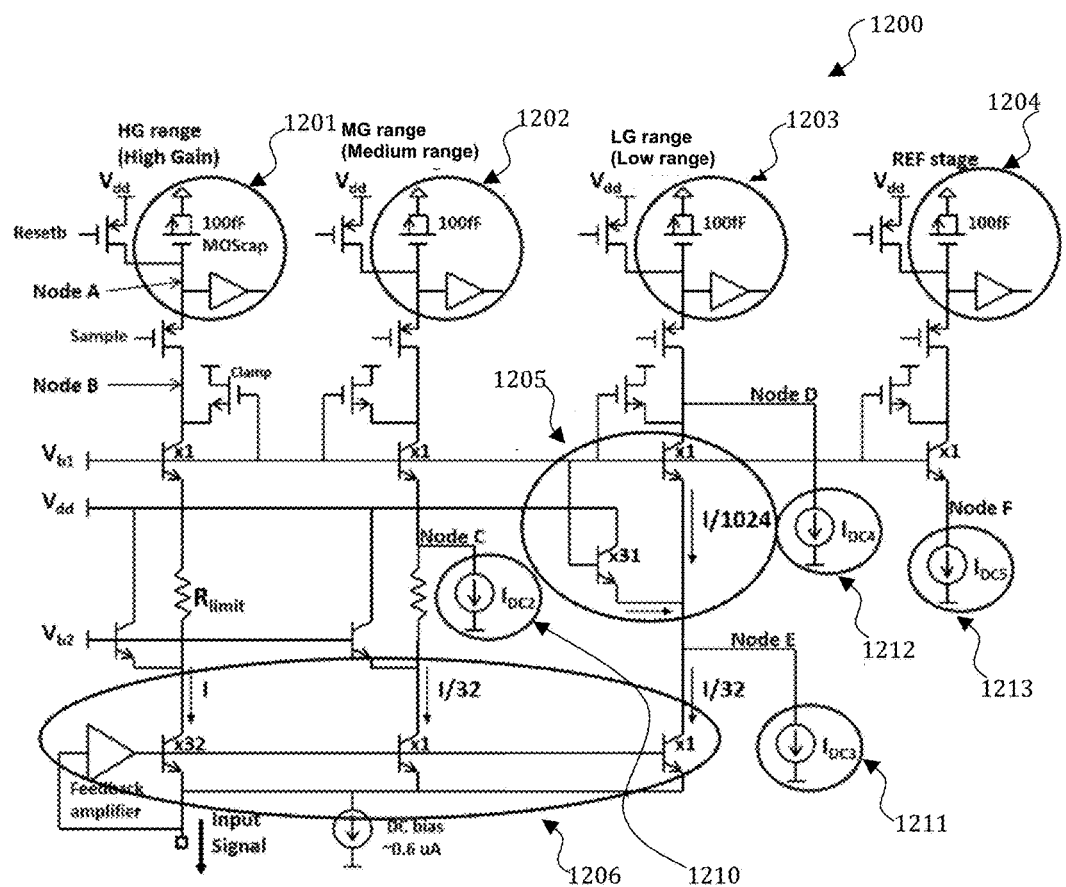
FIG. 12 depicts a diagram of a front end associated with a pixel readout system in accordance with the disclosed embodiments.

FIG. 12 illustrates a diagram 1200 of a specific implementation of an embodiment. This embodiment offers several enhancements that yield substantially improved performance while maintaining a small pixel area. The effectiveness of the pseudo-differential configuration is also improved. In the diagram 1200, an exemplary 3-range implementation is illustrated that targets a dynamic range of $10^5$, using a gain ratio of 32 between each of the ranges.

The key concept for the front end is to make all of the integrators identical (using the same small capacitor and bipolar cascode transistor sizes) to the integrator of the first (High Gain) range. In FIG. 12, four identical integrators 1201-1204 are illustrated. There are therefore no large capacitors required. This lends itself to a very compact physical layout. Equal size integrators 1201-1204 are possible because all the scaling is done with NPN current splitters (current splitter 1025 and current splitter 1026), instead of a combination of splitter ratios and integrator capacitor ratios. The scaling (in this case×32) between the first two ranges is done with the input current splitter 1206. The last two outputs of this first splitter have identical currents (scale ratio of 1). The scaling between the last two ranges is then done with a second splitter 1205, which is incorporated into the cascode. Only the desired fraction (in this case 1/32) of the current into this splitter is routed to the LG range integrator. The rest is diverted to a dedicated low impedance node. The area required for the additional splitter transistors is much smaller than the area that would be needed if the scaling between the last two ranges was done by simply increasing the size of the integration capacitor on the last range by the same factor.

To make the design even more area efficient, MOS caps can be used to form the integrator capacitors 1201-1204. These are considerably smaller than Metal-Insulator-Metal (MIM) and Metal-Oxide-Metal (MOM) caps of the same value. In addition, MOS caps reside on the lowest level of metallization of the chip, whereas MIM caps take considerable area on the upper levels of metal routing, which results in bigger parasitic capacitances and disruption of power, ground, and bias metal routing. However, MOS (in this case NMOS) caps are not linear unless they have a large enough positive voltage bias. Thus, they must be referenced to the lowest supply rail and reset to the most positive rail. This puts the MOS caps in a linear region over the entire voltage range of interest.

FIG. 12 shows several equalizing DC bias currents (bias currents 1210-1213) that have been added to specific nodes in the circuit (Nodes C-F). These are a crucial part of the strategy of using identical integrators in each range. Without the equalizing currents, the DC bias current seen by each integrator would be very different. For example, the HG range would see most of the input DC bias, and the LG range would see a very small fraction of it (~1/1000 in this example). The equalizing currents are sized so that the valid region of interest on each gain range occupies the same absolute voltage space on each integrator capacitor, including the REF gain range.

This is beneficial for several reasons. The frequency response is optimized for all ranges (otherwise the 2nd splitter 1205 would have a very small DC bias and would be too slow). Also, the voltage buffer on each range sees the same absolute voltage space, allowing its design to be simpler and optimized for just that space. With widely differing bias currents, the integrators would have to be operational over a significantly wider absolute voltage space. With equalization, it is much easier to maintain linearity and minimize the value of supply voltage that is required. In addition, the design of the subsequent capacitor storage array is made simpler and easier. And very importantly, common-mode variations such as power supply and bias current values affect all ranges equally. Thus, the REF stage can provide equally good common-mode cancellation for all ranges.

Figure 13:
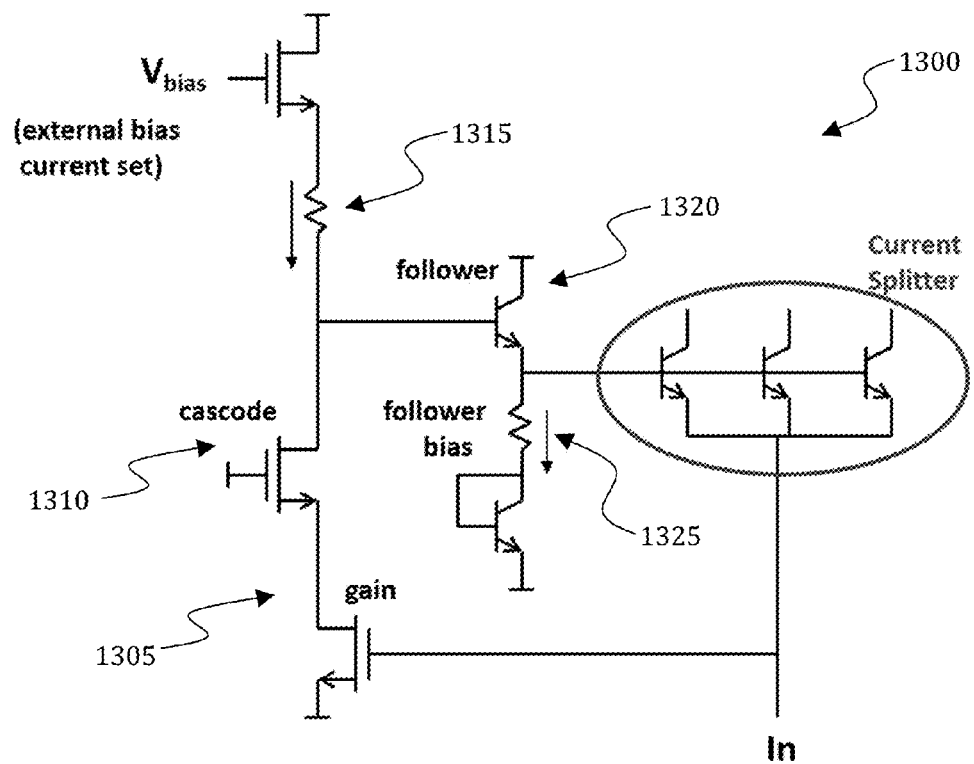
FIG. 13 depicts a diagram of a front end associated with a pixel readout system in accordance with the disclosed embodiments.

The feedback amplifier 1300 used in the front end to actively drive all the splitter base connections, forces much lower current splitter input impedance and higher bandwidth than a simple common base configuration would. The configuration of the feedback amplifier 1300 is illustrated in FIG. 13. This amplifier 1300 is compact and has low quiescent power dissipation and is quite insensitive to supply voltage value variation due to voltage drops on internal power and ground busses.

The amplifier gain element is a MOS (in this case NMOS) transistor 1305, which has a very high DC input resistance so that it does not alter the value of DC bias current going into the splitter. There is a cascode MOS transistor 1310 (in this case NMOS) to enhance speed and to increase the equivalent resistance seen at its drain. The current through this stage is set by the combination of the value of Vbias and a resistor 1315. It is not set with a current mirror referenced to the positive supply as is more typical, and therefore is immune to the supply voltage value. Also, Vbias can be easily adjusted externally to set the desired properties of the amplifier.

An emitter follower 1320 is used to drive the splitter base. This follower 1320 can easily supply any needed splitter base current on demand, but idles at a low DC bias current in order to minimize power dissipation. The follower bias is determined internally by a resistor 1325 which sees a voltage across it of approximately the gate-source voltage (VGS) of the NMOS gain element, which is fairly predictable. Therefore, the amplifier is completely self-biased and relatively immune to variations on the power and ground lines.

Figure 14:
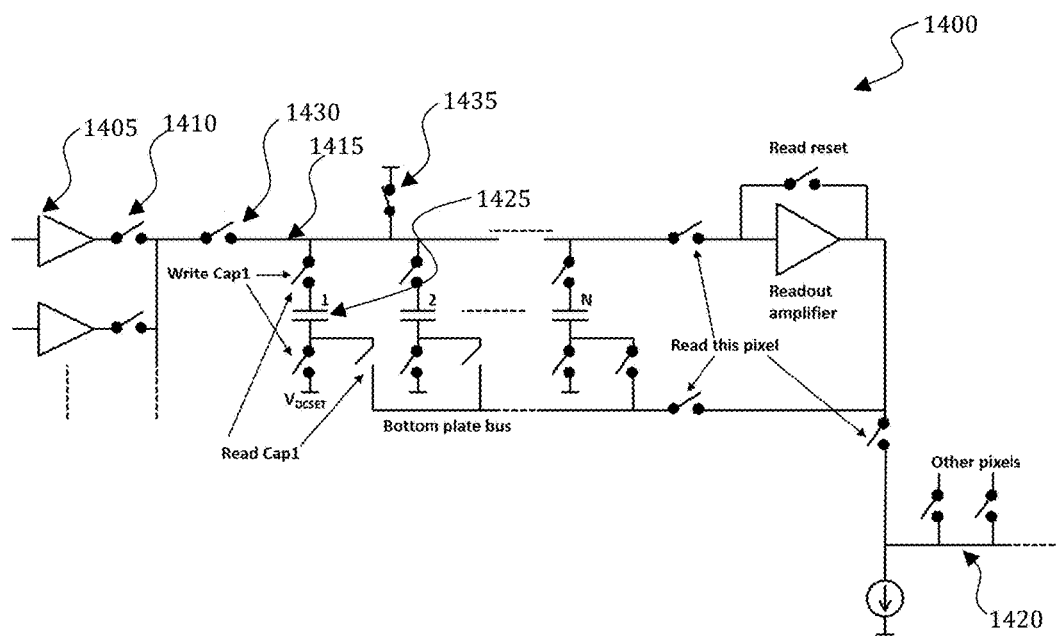
FIG. 14 depicts a diagram of a capacitor storage array associated with a pixel readout system in accordance with the disclosed embodiments.

An exemplary capacitor storage array 1400 is shown in FIG. 14. The voltage buffer 1405 of the selected range is routed through a multiplexer 1410 to the top plate bus 1415 of all the storage capacitors during the acquisition (write) phase of the array. During the read phase, the capacitors are switched into the feedback path of a common source readout amplifier (this is equivalent to an inverting signal follower), and drive a common bus 1420 that reads out a number of pixels one at a time. Since many pixels can be read out on only one common output bus 1420, a given pixel may have to wait for a significant amount of time to be read out. It is imperative that there is insignificant leakage current on the capacitors 1425 during this "hold" time while waiting to be read out, otherwise the values will be corrupted. Therefore, a novel feature is incorporated to hold the top plate bus at an externally set voltage VHOLD during this time. VHOLD is adjusted via a switch 1435 to an appropriate DC voltage so that the VGS of the top write switches (MOS switches in "off" mode) is well below threshold to a level such that the leakage is insignificant.

Figure 15:
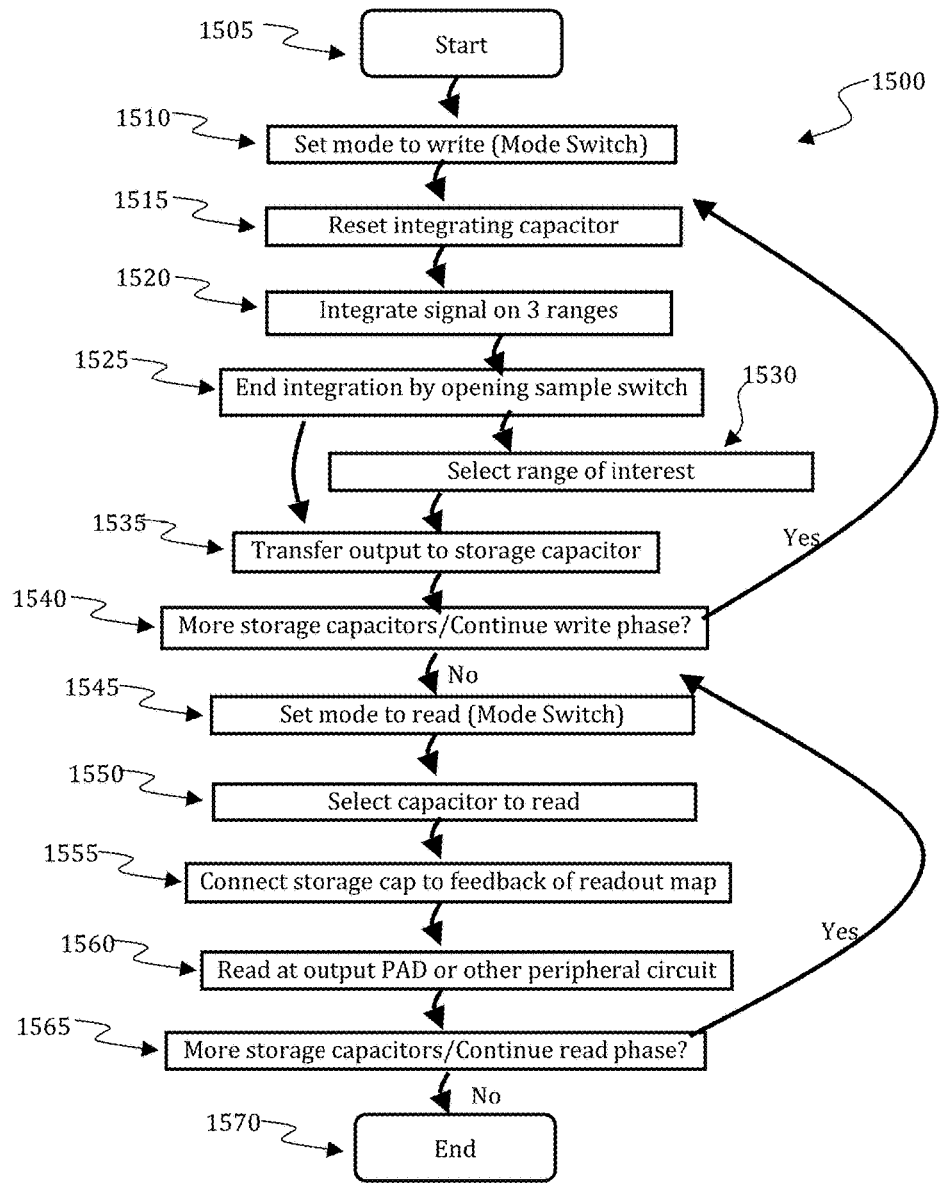
FIG. 15 depicts logical steps associated with a method for reading out a pixel from a detector in accordance with the disclosed embodiments.

FIG. 15 illustrates steps associated with a method 1500 for pixel readout in accordance with the disclosed embodiments. The method begins as shown at step 1505. As shown next at step 1510, the mode can be set to write using the mode switch 1430. As depicted next at step 1515, the reset integrating capacitor is also reset. The signal can then be integrated on 3 ranges, as shown at step 1520.

Opening the sample switch as shown at step 1525 ends the integration. At this point, in some embodiments, a range of interest that is the first non-saturated range of highest sensitivity can be selected at step 1530. Alternatively as indicated at step 1535, the output from the storage capacitor is transferred. A determination must then be made. If there are more storage capacitors, then the write phase method must be continued and iterates as illustrated.

If the write phase is complete, the method continues to step 1545 where the mode can be set to read, again with a mode switch 1430. The capacitor that will be read is selected at step 1550. The next step is to connect the storage capacitor to the feedback of the readout map as shown at step 1555. At step 1560, it is readapt an output PAD or other peripheral circuit. If there are more storage capacitors that require reading in the read phase as shown at step 1565, the method iterates as shown. Otherwise the method is complete and end at step 1570.

Based on the foregoing, it can be appreciated that a number of embodiments, preferred and alternative, are disclosed herein. For example, in an embodiment a pixel readout circuit comprises a front end comprising: a current splitter configured to provide an input signal to at least one integrator; and at least one voltage buffer, range selection logic, and a multiplexor configured to store a desired gain range in a capacitor storage array; and a backend configured to read out the capacitor storage array.

In another embodiment, the at least one integrator comprises at least one of a passive integrator and an active integrator. In an embodiment, the front end further comprises a plurality of bipolar transistors configured to control the current splitter scaling factors to minimize split ratio errors.

In another embodiment, an output of the current splitter provides a feed to at least one other current splitter providing scaling of an output current that is provided to the at least one integrator. The pixel readout circuit can further comprise a sample switch opened at an end of an integration period and configured between a cascode transistor and an integrator capacitor.

In another embodiment, the pixel readout circuit further comprises a cascode transistor separating the sample switch and the at least one integrator. In another embodiment, the pixel readout circuit further comprises a current limit circuit preceding the cascode transistor, thereby shunting away excess current on at least one range. In another embodiment, a clamp transistor is configured to prevent bipolar transistor saturation.

In another embodiment of the pixel readout circuit, a reference stage is configured to integrate a DC bias current thereby providing a pseudo-differential output signal. A DC current source provides slight biasing of the current splitter in the same direction as the expected signal due to radiation. In another embodiment, the current splitter is operably interfaced with a feedback amplifier. The feedback amplifier comprises a self-biasing amplifier.

In another embodiment, an output of the at least one integrator is buffered and connected to the capacitor storage array during a write phase. In another embodiment, a read phase is provided wherein the capacitor storage array is configured in a feedback path of a readout amplifier.

In yet another embodiment, a large area, gapless, detection system comprises at least one sensor; an interposer operably connected to the at least one sensor; and at least one application specific integrated circuit operably connected to the sensor via the interposer comprising at least one pixel wherein the at least one pixel comprises a readout circuit comprising: a front end further comprising a current splitter configured to provide an input signal to at least one integrator; and at least one voltage buffer, range selection logic, and a multiplexor configured to store a desired gain range in a capacitor storage array; and a backend configured to read out the capacitor storage array.

In another embodiment, the at least one integrator comprises at least one of a passive integrator and an active integrator. In another embodiment, a front end further comprises a plurality of bipolar transistors configured to control the current splitter scaling factors to minimize split ratio errors. A range of the current splitter is at least one other current splitter.

In another embodiment, the large area, gapless, detection system further comprises a sample switch opened at an end of an integration period and configured between a cascode transistor and an integrator capacitor.

In yet another embodiment, a large area, gapless, detection system comprises at least one sensor; an interposer operably connected to the at least one sensor; and at least one application specific integrated circuit operably connected to the sensor via the interposer comprising at least one pixel wherein the at least one pixel comprises a readout circuit comprising: a front end further comprising a current splitter configured to provide an input signal to at least one integrator; at least one voltage buffer, range selection logic, a plurality of bipolar transistors configured to control the current splitter scaling factors to minimize split ratio errors, a multiplexor configured to store a desired gain range in a capacitor storage array, a sample switch opened at an end of an integration period and configured between a cascode transistor and an integrator capacitor, a cascode transistor separating the sample switch and the at least one integrator; and a backend configured to read out the capacitor storage array.

In an embodiment, the large area, gapless, detection system comprises a clamp transistor configured to prevent bipolar transistor saturation; a read phase wherein the capacitor storage array is configured in feedback path of a readout amplifier; wherein the current splitter is operably interfaced with a feedback amplifier the feedback amplifier comprising a self-biasing amplifier; and wherein an output of the at least one integrator is buffered and connected to the capacitor storage array during a write phase.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A pixel readout circuit comprising:
a frontend comprising:
a current splitter configured between an input signal source and at least one integrator, said current splitter providing an output signal to said at least one integrator;
a range selection logic and a multiplexor which are configured to store an integration performed by said at least one integrator for a desired gain range in a capacitor storage array; and
a back end configured to read out said capacitor storage array.

2. The pixel readout circuit of claim 1 further comprising:
at least one voltage buffer connected to an output of said integrator wherein said at least one Integrator comprises a passive integrator.

3. The pixel readout circuit of claim 1 wherein said at least one integrator comprises an active integrator.

4. The pixel readout circuit of claim 1 wherein said frontend further comprises:
a plurality of bipolar transistors configured to control said current splitter scaling factors to minimize spilt ratio errors;
wherein an output of said current splitter provides a feed to at least one other current splitter providing scaling of an output current that is provided to said at least one integrator.

5. The pixel readout circuit of claim 1 further comprising:
a sample switch opened at an end of an integration period and configured between a cascode transistor and an integrator capacitor.

6. The pixel readout circuit of claim 1 further comprising:
a cascode transistor separating said sample switch and said at least one integrator.

7. The pixel readout circuit of claim 6 further comprising:
a current limit circuit preceding said cascode transistor, thereby shunting away excess current on at least one range.

8. The pixel readout circuit of claim 1 further comprising:
a clamp transistor configured to prevent bipolar transistor saturation.

9. The pixel readout circuit of claim 1 further comprising:
a reference stage configured to integrate a DC bias current thereby providing a pseudo-differential output signal.

10. The pixel readout circuit of claim 1 wherein said current splitter is operably interfaced with a feedback amplifier.

11. The pixel readout circuit of claim 10 wherein said feedback amplifier comprises a self-biasing amplifier.

12. The pixel readout circuit of claim 1 wherein an output of said at least one integrator is buffered and connected to said capacitor storage array during a write phase.

13. The pixel readout circuit of claim 1 further comprising:
a read phase wherein said capacitor storage array is configured in a feedback path of a readout amplifier.

14. A detection method comprising:
collecting input with at least one sensor;
processing said input with a readout circuit, said processing further comprising:
splitting an input signal provided by said at least one sensor with a current splitter;
providing an output signal from said current splitter to at least one integrator;
integrating said output signal with said at least one integrator;

storing said integrated output signal over a desired gain range in a capacitor storage array by using a range selection logic and a multiplexor; and reading out said capacitor storage array with a back end configured to read out said capacitor storage array.

15. The detection method of claim 14 wherein said at least one integrator comprises at least one of:

a passive integrator connected to at least one voltage buffer; and an active integrator.

16. The detection method of claim 14 further comprising:

controlling current splitter scaling factors with a plurality of bipolar transistors to minimize split ratio errors.

17. The detection method of claim 14 further comprising:

separating a sample switch and said at least one integrator with a cascode transistor: and shunting away excess current with a current limit circuit preceding said cascode transistor.

18. The detection method of claim 17 further comprising:

opening said sample switch at an end of an integration period.

19. A system comprising:

a readout circuit, said readout circuit further comprising:

a front end comprising:

a current splitter configured between an input signal source and at least one integrator, said current splitter providing an output signal to said at least one integrator;

a plurality of bipolar transistors configured to control said current splitter scaling factors to minimize split ratio errors;

a range selection logic, a multiplexor and at least one voltage buffer which are configured to store an integration performed by said at least one integrator for a desired gain range in a capacitor storage array;

a sample switch opened at an end of an integration period and configured between a cascode transistor and an integrator capacitor;

a cascode transistor separating said sample switch and said at least one integrator; and a back end configured to read out said capacitor storage array.

20. The system of claim 19 further comprising:

a clamp transistor configured to prevent bipolar transistor saturation;

a read phase wherein said capacitor storage array is configured in a feedback path of a readout amplifier;

wherein said current splitter is operably interfaced with a feedback amplifier said feedback amplifier comprising a self-biasing amplifier; and wherein an output of said at least one integrator is buffered and connected to said capacitor storage array during a write phase.

* * * * *